United States Patent
Narui

(10) Patent No.: US 8,508,969 B2
(45) Date of Patent: Aug. 13, 2013

(54) SEMICONDUCTOR DEVICE HAVING HIERARCHICALLY STRUCTURED BIT LINES AND SYSTEM INCLUDING THE SAME

(75) Inventor: Seiji Narui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/533,896

(22) Filed: Jun. 26, 2012

(65) Prior Publication Data

US 2012/0300529 A1    Nov. 29, 2012

Related U.S. Application Data

(63) Continuation of application No. 12/805,015, filed on Jul. 7, 2010, now Pat. No. 8,248,834.

(30) Foreign Application Priority Data

Jul. 30, 2009 (JP) ................................. 2009-177404

(51) Int. Cl.
*G11C 5/06* (2006.01)

(52) U.S. Cl.
USPC .... 365/63; 365/205; 365/230.03; 365/185.13

(58) Field of Classification Search
USPC .......................... 365/63, 205, 230.03, 185.13
See application file for complete search history.

(56) References Cited

U.S. PATENT DOCUMENTS

| | | | |
|---|---|---|---|
| 5,682,343 A | | 10/1997 | Tomishima et al. |
| 5,999,480 A | * | 12/1999 | Ong et al. ................ 365/230.06 |
| 2006/0023555 A1 | | 2/2006 | Morishima |
| 2007/0147101 A1 | | 6/2007 | Chae |
| 2007/0230245 A1 | | 10/2007 | Watanabe et al. |
| 2008/0175040 A1 | | 7/2008 | Kushida et al. |
| 2009/0073760 A1 | * | 3/2009 | Betser et al. ................ 365/185.2 |
| 2010/0259962 A1 | * | 10/2010 | Yan et al. ......................... 365/51 |
| 2011/0299340 A1 | * | 12/2011 | Samachisa et al. ...... 365/185.21 |
| 2012/0147650 A1 | * | 6/2012 | Samachisa et al. ............. 365/51 |

* cited by examiner

*Primary Examiner* — Tuan T. Nguyen
(74) *Attorney, Agent, or Firm* — McGinn IP Law Group, PLLC

(57) ABSTRACT

A device includes a first sense amplifier array including a plurality of first sense amplifiers arranged in a first direction, each of the first sense amplifiers including first and second nodes, a plurality of first global bit lines extending in a second direction crossing the first direction, the first global bit lines being arranged in the first direction on a left side of the first sense amplifier array so that the first global bit lines being operatively connected to the first node of an associated one of the first sense amplifiers, and a plurality of second global bit lines extending in the second direction, the second global bit lines being arranged in the first direction on a right side of the first sense amplifier array so that the second global bit lines being operatively connected to the second node of the associated one of the first sense amplifiers.

26 Claims, 7 Drawing Sheets

SEMICONDUCTOR DEVICE HAVING HIERARCHICALLY STRUCTURED BIT LINES AND SYSTEM INCLUDING THE SAME

The present application is a Continuation Application of U.S. patent application Ser. No. 12/805,015, filed on Jul. 7, 2010, now U.S. Pat. No. 8,248,834 which is based and claims priority from Japanese patent application No. 2009-177404, filed on Jul. 30, 2009, the entire contents of which is incorporated herein by reference.

BACKGROUND OF THE INVENTION

1. Field of the Invention

The present invention relates to a semiconductor device, and more particularly relates to a semiconductor device having hierarchically structured bit lines. Furthermore, the present invention relates to a system including the semiconductor device.

2. Description of Related Art

Some semiconductor devices such as DRAM (Dynamic Random Access Memory) include local bit lines and global bit lines that are hierarchically structured (see U.S. Pat. No. 5,682,343). The local bit line corresponds to a low-order bit and is connected to a memory cell. On the other hand, the global bit line corresponds to a high-order bit and is connected to a sense amplifier. With hierarchized bit lines, it is possible to increase the number of memory cells allocated to one sense amplifier, while shortening a line length of the local bit line that has a relatively high electrical resistance.

In a semiconductor device described in U.S. Pat. No. 5,682,343, adopts so-called open bit architecture. That is, a pair of global bit lines connected to a sense amplifier is allocated to different memory mats from each other. As is widely known, unlike a folded bit line architecture, because word line noise is not canceled in the open bit architecture, the word line noise is superimposed on a bit line of an access side. To deal with this problem, as shown in FIGS. 18 and 19 of U.S. Pat. No. 5,682,343, a dummy word line is used to cancel word line noise.

However, in the semiconductor device described in the above patent document, although word line noise can be canceled, it is not possible to deal with a difference in a parasitic CR distributed constant based on a position of a selected local bit line. Because a plurality of bit lines are allocated to one global bit line, a slight difference occurs in the parasitic CR distributed constant between a case where a local bit line near a sense amplifier is selected and a case where a local bit line far from the sense amplifier is selected. In the semiconductor device described in the above patent document, because a memory mat provided with the dummy word line is fixed, the sensing sensitivity degrades due to a difference in the parasitic CR distributed constant caused by the position of the selected local bit line.

Meanwhile, in recent years, a $4F^2$ memory cell has been developed. In a typical $4F^2$ memory cell, because the bit line is embedded in a semiconductor substrate, the word line noise is considerably small. In this type of semiconductor device, an influence of a change of the parasitic CR distributed constant caused by the position of the selected local bit line is rather dominant than an influence of the word line noise. Therefore, in this case, there is little necessity of using the dummy word line.

SUMMARY

In one embodiment, there is provided a device comprising: a first sense amplifier array including a plurality of first sense amplifiers that are arranged in a first direction, each of the first sense amplifiers including first and second nodes: a plurality of first global bit lines each extending in a second direction crossing the first direction, the first global bit lines being arranged in the first direction on a left side of the first sense amplifier array so that each of the first global bit lines being operatively connected to the first node of an associated one of the first sense amplifiers; a plurality of second global bit lines each extending in the second direction, the second global bit lines being arranged in the first direction on a right side of the first sense amplifier array so that each of the second global bit lines being operatively connected to the second node of the associated one of the first sense amplifiers; a first memory block including a plurality of first local bit lines that are arranged in the first direction and a plurality of first hierarchy switches each coupled between an associated one of the first global bit lines and an associated one of the first local bit lines, the first memory block being disposed on the left side of the first sense amplifier array;

a second memory block including a plurality of second local bit lines that are arranged in the first dire lion and a plurality of second hierarchy switches each coupled between an associated one of the first global bit lines and an associated one of the second local bit lines, the second memory block being disposed on the left side of the first sense amplifier array and sandwiched between the first sense amp her array and the first memory block;

a third memory block including a plurality of third local bit lines that are arranged in the first direction and a plurality of third hierarchy switches each coupled between an associated one of the second global bit lines and an associated one of the third local bit lines, the third memory block being disposed on the right side of the first sense amplifier array; and a fourth memory block including a plurality of fourth local bit lines that are arranged in the first direction and a plurality of fourth hierarchy switches each coupled between an associated one of the second global bit lines and an associated one of the fourth local bit lines, the fourth memory block being disposed on the right side of the first sense amplifier array and sandwiched between the first sense amplifier array and the third memory block;

the first, second, third and fourth memory blocks being address-mapped such that the first and third hierarchy switches are rendered conductive while keeping the second and fourth hierarchy switches non-conductive and the second and fourth hierarchy switches are rendered conductive while keeping the first and third hierarchy switches non-conductive.

According to the present invention, because a first hierarchy switch and a second hierarchy switch having the same distance from a sense amplifier are activated among a plurality of first and second hierarchy switches, there is substantially no difference in the parasitic CR distributed constant regardless of a bit line to be selected.

As a result, even when a line length of a global bit line is long, it is possible to prevent the sensing sensitivity from being degraded.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Figure 1:
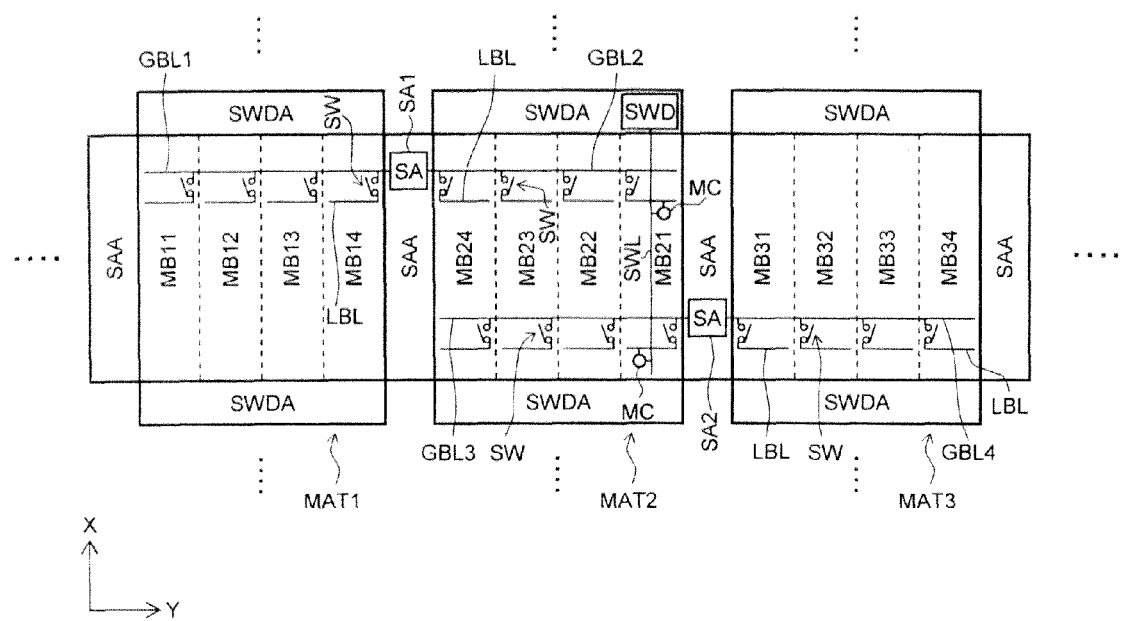
FIG. 1 is a schematic diagram for explaining a memory mat structure of a semiconductor device according to an embodiment of the present invention.

A representative example of the technical concept for attaining the object of the present invention is described below. Note that the claimed contents of present invention are not limited to this technical concept, and are defined by the descriptions of the appended claims. That is, the technical concept of the present invention is that, in a semiconductor device of a hierarchized open bit type, a pair of local bit lines are selected, which are included in a memory mat for which an access is requested (an access side memory mat) and a neighboring memory mat across a sense amplifier (a reference side memory mat), respectively, with the same distance from the sense amplifier. Because a pair of global bit lines connected to the sense amplifier (which are composed of a global bit line of the access side memory mat and a global bit line of the reference side memory mat) are connected to local bit lines with the same distance via hierarchy switches that connect the global bit line and the local bit line, respectively, a parasitic CR model of the access side is the same as that of the reference side. As a result, even when a line length of the global bit line is long, it is possible to ensure a high sensing sensitivity.

Furthermore, in a configuration in which a plurality of memory mats are arranged in a first direction sandwiching a sense amplifier therebetween, when a predetermined memory block (an access side memory block) is selected among a plurality of memory blocks included in the access side memory mat, memory blocks (reference side memory blocks) having the same distance from a corresponding sense amplifier are selected among a plurality of memory blocks included in memory mats (reference side memory mats) at both sides of each of sense amplifiers on the left side and the right side corresponding to a first global bit line of an access side that is amplified by a left side sense amplifier array and a second global bit line of an access side that is amplified by a right side sense amplifier array, respectively. Therefore, it is possible to ensure a high sensing sensitively including a local bit line of a reference side memory block.

The technical concept in the open bit architecture has the following feature. That is, when a memory array is configured in such a manner that a plurality of memory mats and a plurality of sense amplifiers are arranged in a first direction, the number of memory cells (to which an external address is allocated) connected to local bit lines of the outermost memory mats (memory mats at the both sides) is a half of the number of memory cells arranged in the other memory mats. Therefore, with an increase of a memory capacity by arranging a plurality of memory blocks in which local bit lines are included via a plurality of hierarchy switches, it is possible to reduce the number of sense amplifier arrays to be arranged between the memory mats and to suppress an increase of the memory array. If the number of memory blocks is small, a time constant τA caused by a parasitic resistance and a parasitic capacitance of a global bit line is relatively smaller than a time constant τB caused by a parasitic resistance and a parasitic capacitance of a local bit line to which a plurality of memory cells are connected. However, in the above-described configuration in which the number of memory blocks is large, the influence of the time constant τA increases. This is because the parasitic resistance and the parasitic capacitance increase due to an increase of a total length of the global bit line. In addition, a parasitic resistance of a hierarchy switch composed of a transistor and the like at ON state viewed from the sense amplifier positions the time constant τB of a farther local bit line, which than the time constant τA of the global bit line, as a distributed constant model that is farther away. A 1-intersection 1-cell type (an access transistor included in a cell has a vertical transistor structure) in which an arrangement pitch of the local bit line is most stringent and a high parasitic resistance of a hierarchy switch that is configured with a vertical transistor structure corresponding to the 1-intersection 1-cell type at the ON state further foster these problems. The technical concept of the present invention is generally effective in a memory array that employs an open bit line structure in which careful caution is required in an unbalance between a sensing bit line and a reference side bit line than in the folded bit architecture and a hierarchized bit line structure having a large number of memory blocks.

Preferred embodiments of the present invention will be explained below in detail with reference to the accompanying drawings.

FIG. 1 is a schematic diagram for explaining a memory mat structure of a semiconductor device according to an embodiment of the present invention. Although a large number of memory mats are laid out in a matrix form in a word line direction (an X direction) and a bit line direction (a Y direction; a first direction) in an actual case, only three memory mats MAT1 to MAT3 that are arranged in a row in the bit line direction (the Y direction) are shown in FIG. 1. In the following explanations, when it is not necessary to designate a specific memory mat or when it is necessary to refer all the memory mats in a collective manner, the memory mats MAT1 to MAT3 are simply referred to as "memory mat MAT". An area composed of a plurality of sense amplifier arrays and a plurality of memory mats arranged in the first direction is referred to as "memory array".

As shown in FIG. 1, a sub-word driver array SWDA is provided at both sides of the memory mat MAT in the X direction. The sub-word driver array SWDA includes a plurality of sub-word drivers SWD, and each of the sub-word drivers SWD drives a sub-word line SWL provided in the memory at MAT. The sub-word line SWL extends in the X direction in the memory mat MAT, and is provided for selecting a memory cell MC. Only one sub-word line SWL in the memory mat MAT2 is shown in FIG. 1. In one memory mat, the sub-word line SWL of the sub-word driver array SWDA at the upper side and the sub-word line SWL of the sub-word driver array SWDA at the lower side (not shown) are alternately arranged in a skewered manner. A sub-word lines SWL are also selected in adjacent memory mats that are arranged in the X direction from the sub-word driver array SWDA at each of the upper side and the lower side. The memory cell is a $4F^2$ memory cell as an example, which is described later with reference to FIG. 5, and is a 1-intersection 1-cell type in which a memory cell is arranged at every intersections of the sub-word line SWL with a local bit line LBL (described later).

Furthermore, a sense amplifier array SAA is arranged at both sides of the memory mat MAT in the Y direction. The sense amplifier array SAA includes a plurality of sense amplifiers SA, and each of the sense amplifiers SA amplifies a potential difference between a pair of global bit lines GBL (which are composed of the global bit lines arranged in memory mats at both sides of the sense amplifier). In FIG. 1, only one sense amplifier SA1 in the sense amplifier array SAA located between the memory mats MAT1 and MAT2 and one sense amplifier SA2 in the sense amplifier array SAA located between the memory mats MAT2 and MAT3 are shown. A circuit configuration of the sense amplifier SA is not limited to any particular format. For example, a typical flip-flop circuit can be used to form the sense amplifier SA. The pair of the global bit lines GBL are high-order bit lines arranged in the memory mats MAT adjacent to each other in the Y direction, respectively, extending in the Y direction.

As shown in FIG. 1, in the present embodiment, each of the memory mats MAT is divided into four memory blocks MB×1 to MB×4 that are arranged in a row in the Y direction. However, the number of divisions in the memory mat MAT is not limited to four. In the following explanations, when it is not necessary to designate a specific memory block or when it is necessary to refer all the memory blocks in a collective manner, the memory blocks MB×1 to MB×4 are simply referred to as "memory block MB".

The memory block MB includes a plurality of local bit lines LBL that are arranged extending in the Y direction. The local bit lines LBL are low-order bit lines with respect to the high-order global bit lines GBL. The memory cell MC is arranged at every intersection of the local bit lines LBL and the sub-word lines SWL. Therefore, when a predetermined sub-word line SWL is activated, the memory cell MC connecting o the activated sub-word line SWL is selected, by which data is exchanged via the local bit line LBL.

As shown in FIG. 1, a hierarchy switch SW is arranged between each of the local bit lines LBL and the global bit line GBL. One global bit line GBL is connected to any one of four local bit lines LBL corresponding to the global bit line GBL, by the hierarchy switch SW. The hierarchy switch SW can be configured with an N-channel MOS transistor. Alternatively, the hierarchy switch SW can also be configured with a CMOS transfer gate. The connection scheme includes a first case where one global bit line GBL and one local bit line LBL are connected to each other in a one-to-one relationship and a second case where one global bit line GBL is connected to a plurality of local bit lines LBL in one-to-n relationship. An arrangement pitch of the local bit lines LBL is equal to or less than 2F with a $4F^2$ memory cell including an access transistor of a vertical transistor structure (where F is the minimum feature size). The hierarchy switch SW is attached to one local bit line LBL, and therefore a size (current drivability) of the hierarchy switch SW that is composed of a vertical transistor structure like the access transistor is small, and the ON resistance in the ON state is large. Details on this aspect are described later with an explanation of FIG. 5.

Figure 2:
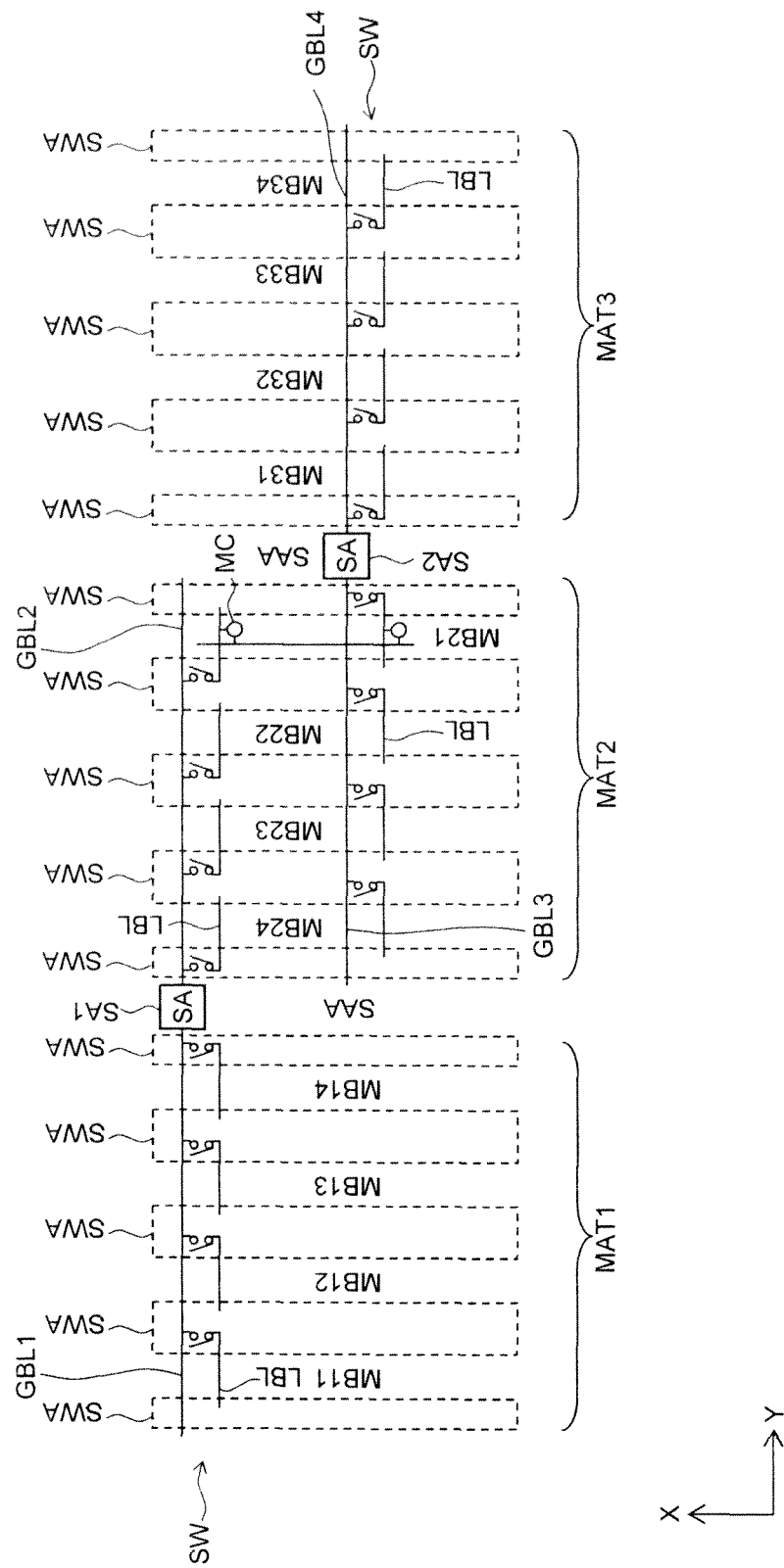
FIG. 2 is a circuit diagram for explaining a hierarchy structure of the bit lines in detail.

FIG. 2 is a circuit diagram for explaining a hierarchy structure of the bit lines in detail.

As shown in FIG. 2, the sense amplifier SA1 between the memory mats MAT1 and MAT2 is connected to global bit lines GBL1 and GBL2. The global bit lines GBL1 and GBL2 are allocated to the memory mats MAT1 and MAT2, respectively. Similarly, the sense amplifier SA2 between the memory mats MAT2 and MATS is connected to global bit lines GBL3 and GBL4. The global bit lines GBL3 and GBL4 are allocated to the memory mats MAT2 and MAT3, respectively.

One of the pair of the global bit lines GBL is an access side and the other is a reference side. A potential difference between the pair of the global bit lines is amplified by the sense amplifier SA. The access side is a side that is connected to the target memory cell MC for a read operation or a write operation (the sub-word line SWL is activated so that information of the memory cell MC is provided to a corresponding local bit line LBL), and the reference side is a side that is not connected to the target memory cell MC for the read operation or the write operation. In the semiconductor device according to the present invention, the global bit line GBL of the reference side is not connected to a dummy cell, either. However, in the present invention, although it is possible to connect the global bit line GBL of the reference side to a dummy cell, it is not really necessary as described later.

As shown in FIG. 2, the pair of the global bit lines GBL are respectively allocated to two memory mats MAT that are arranged in a row across the sense amplifier array SAA in the Y direction. Therefore, in case the global bit line GBL included in one memory mat MAT is set as access side, the global bit line GBL included in the other memory mat MAT that is arranged in a row is to be set as the reference side. For example, when the memory mat MAT2 is selected, by which the global bit lines GBL2 and GBL3 become the access side, the global bit lines GBL1 and GBL4 included in the memory mats MAT1 and MAT3, respectively, become the reference side. In this case, the feature of the present invention is that, when a memory block MB21 becomes the access side, a memory block MB11 and a memory block MB31 become the reference side. The distances of the memory block MB21 and the memory block MB11 from the sense amplifier SA1 are equal to each other, and the distances of the memory block MB21 and the memory block MB31 from the sense amplifier SA2 are equal to each other. This is achieved by a control of a hierarchy switch array SWA corresponding to each memory block. Details on the control of the hierarchy switch array SWA are described later FIG. 3.

As shown in FIG. 2, the hierarchy switch array SWA composed of a plurality of hierarchy switches SW is arranged between two memory blocks MB that are adjacent to each other in the Y direction and between the memory block MB and the sense amplifier array SAA. Specifically, the hierarchy switch array SWA is arranged at both sides of the memory block MB in the Y direction, and a plurality of local bit line LBL arranged in the X direction are connected to the hierarchy switches SW arranged at both sides in the Y direction in an alternate manner.

Figure 3:
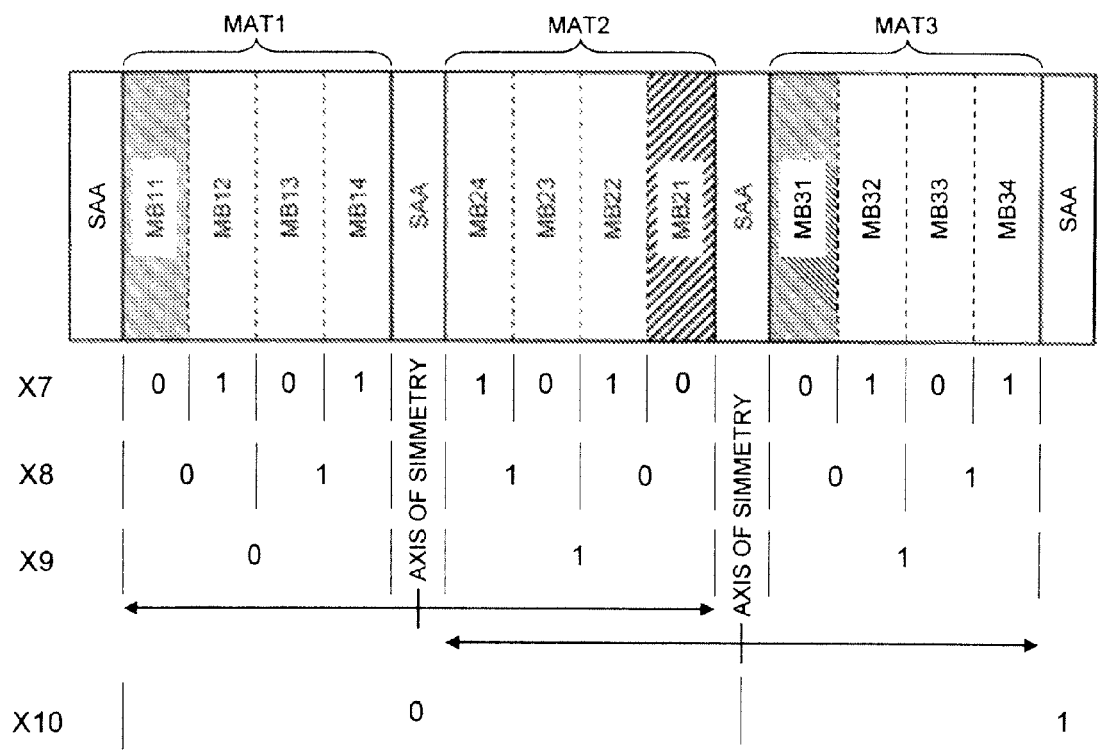
FIG. 3 is a schematic diagram for explaining an address allocation of the memory mat and the memory block.

FIG. 3 is a schematic diagram for explaining an address allocation of the memory mat MAT and the memory block MB.

In FIG. 3, the memory mat MAT is selected by bits X9 to X10 of a row address, and the memory block MB is selected by bits X7 and X8 of the row address. Although a portion above a bit X11 is also used to select the memory mat MAT because there are a large number of memory mats MAT in an actual case, it is omitted in the present embodiment for simplifying explanations.

As shown in FIG. 3, the address of the memory block MB is allocated symmetrically with respect to the sense amplifier array SAA. That is, in two memory mats MAT that are adjacent to each other in the Y direction, logics of the bits X7 and X8 of the row address used to select the memory block MB are symmetric with respect to the sense amplifier array SAA as the axis of symmetry. In addition, in the two memory mats MAT that are adjacent to each other in the Y direction, either one of the bits X9 and X10 of the row address is different. For example, only a logic of the bit X9 of the allocated row address is inverted between the memory block MB11 and the memory block MB21, and only a logic of the bit X10 of the allocated row address is inverted between the memory block MB21 and the memory block MB31.

One of the memory blocks MB located in a mirror position with respect to the sense amplifier array SAA becomes the access side, and the other becomes the reference side. This makes the distributed constants including a parasitic CR model (a time constant τG) of the global bit lines GBL and a parasitic CR model (a time constant τL) of the local bit lines LBL of the access side and the reference side equal to each other, from which it is possible to achieve a high sensing sensitivity even when a line length of the global bit line GBL is long. Details on this aspect are described with reference to FIG. 6 (an operation of the semiconductor device). Furthermore, although it is not particularly limited, it is preferable that an address of the sub-word line SWL should be also allocated symmetrically with respect to the sense amplifier array SAA. With this configuration, parasitic CR models (a time constant τ) in the local bit lines LBL of the access side and the reference side become equal to each other, which can be easily understood by those skilled in the art.

Figure 4:
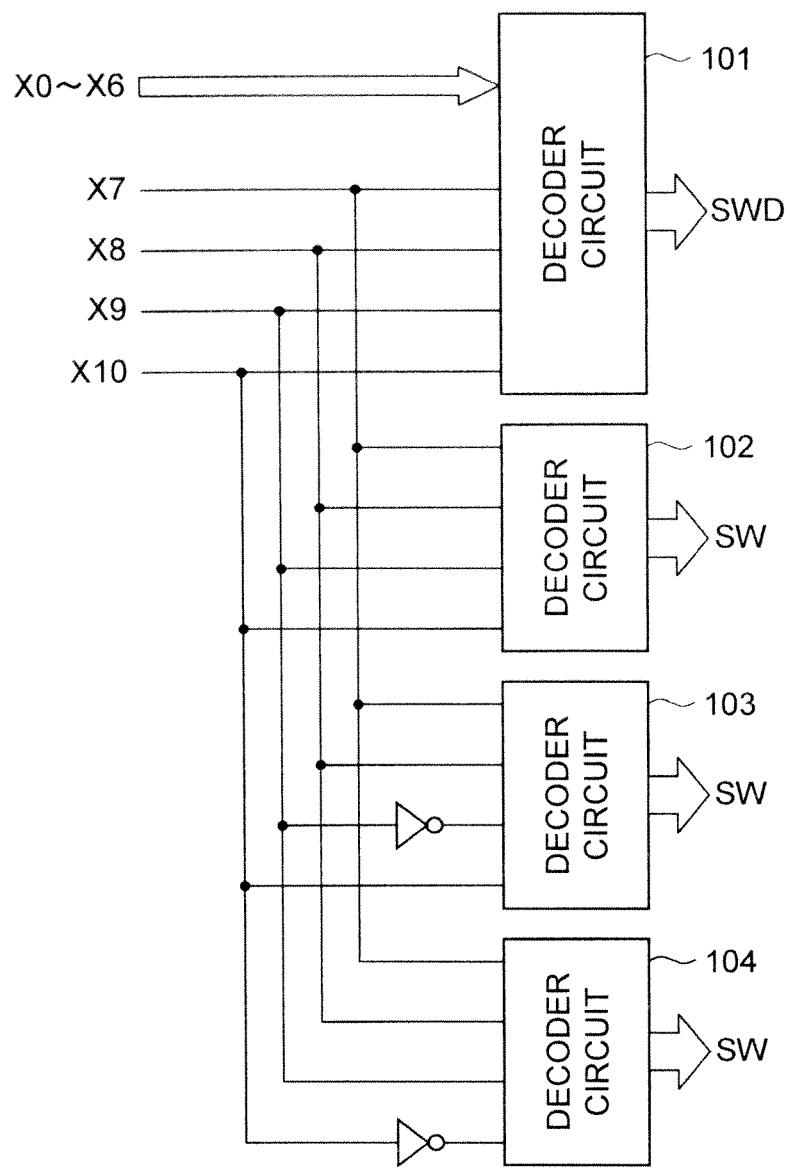
FIG. 4 is a block diagram of a control circuit for selecting the sub-word driver and the hierarchy switch.

FIG. 4 is a block diagram of a control circuit 100 for selecting the sub-word driver SWD and the hierarchy switch SW.

As shown in FIG. 4, the control circuit 100 includes decoder circuits 101 to 104. The decoder circuit 101 selects a sub-word driver SWD it receives a row address X0 to X10 (or more) for accessing and selects any one of the sub-word lines SWL based on the received row address. Among the row address X0 to X10 (or more), a portion equal to or higher than X9 is used to select a memory mat MAT, a portion including X7 and X8 is used to select the memory block MB included in the selected memory mat MAT, and a portion including X0 to X6 is used to select a sub-word driver SWD included in the selected memory block MB. With this configuration, only one of the sub-word lines SWL is selected in at least three memory mats MAT arranged in a row in the Y direction. For example, the sub-word line SWL in the memory block MB21 on which a diagonally right up hatching is applied is selected in FIG. 3. That is, the memory block MB21 is an access side block.

Each of the decoder circuits 102 to 104 selects a hierarchy switch SW, and it receives the row address X7 to X10 (or more) for accessing and connects any one of the local bit lines LBL to the global bit line GBL based on the received row address. Among these decoder circuits, the decoder circuit 102 is used to connect a local bit line LBL in the access side block to the global bit line GBL, to which the row address X7 to X10 (or more) is input as it is. Therefore, the memory block MB that is selected by the decoder circuit 102 is the same as the access side block that is selected by the decoder circuit 101. As described above, the memory block MB21 is the access side block in the example shown in FIG. 3.

On the other hand, each of the decoder circuits 103 and 104 connects the local bit line LBL included in a reference side block to the global bit line GBL. Specifically, although the row address X7 to X10 (or more) is input to each of the decoder circuits 103 and 104, a logic of the bit X9 that is input to the decoder circuit 103 is inverted, and a logic of the bit X10 that is input to the decoder circuit 104 is inverted. As a result, each of the memory blocks selected by the decoder circuits 103 and 104 is the reference side block that is located in a mirror position with respect to the access side block when the sense amplifier array SAA is taken as the axis of symmetry. In the example shown in FIG. 3, the memory blocks MB11 and MB31 on which a diagonally left up hatching is applied are the reference side blocks.

As shown in FIG. 3, the memory blocks MB21 and MB11 are positioned symmetrically with respect to the sense amplifier array SAA with the same row address except that the bit X9 is inverted. Similarly, the memory blocks MB21 and MB31 are positioned symmetrically with respect to the sense amplifier array SAA with the same row address except that the bit X10 is inverted.

Figure 5:
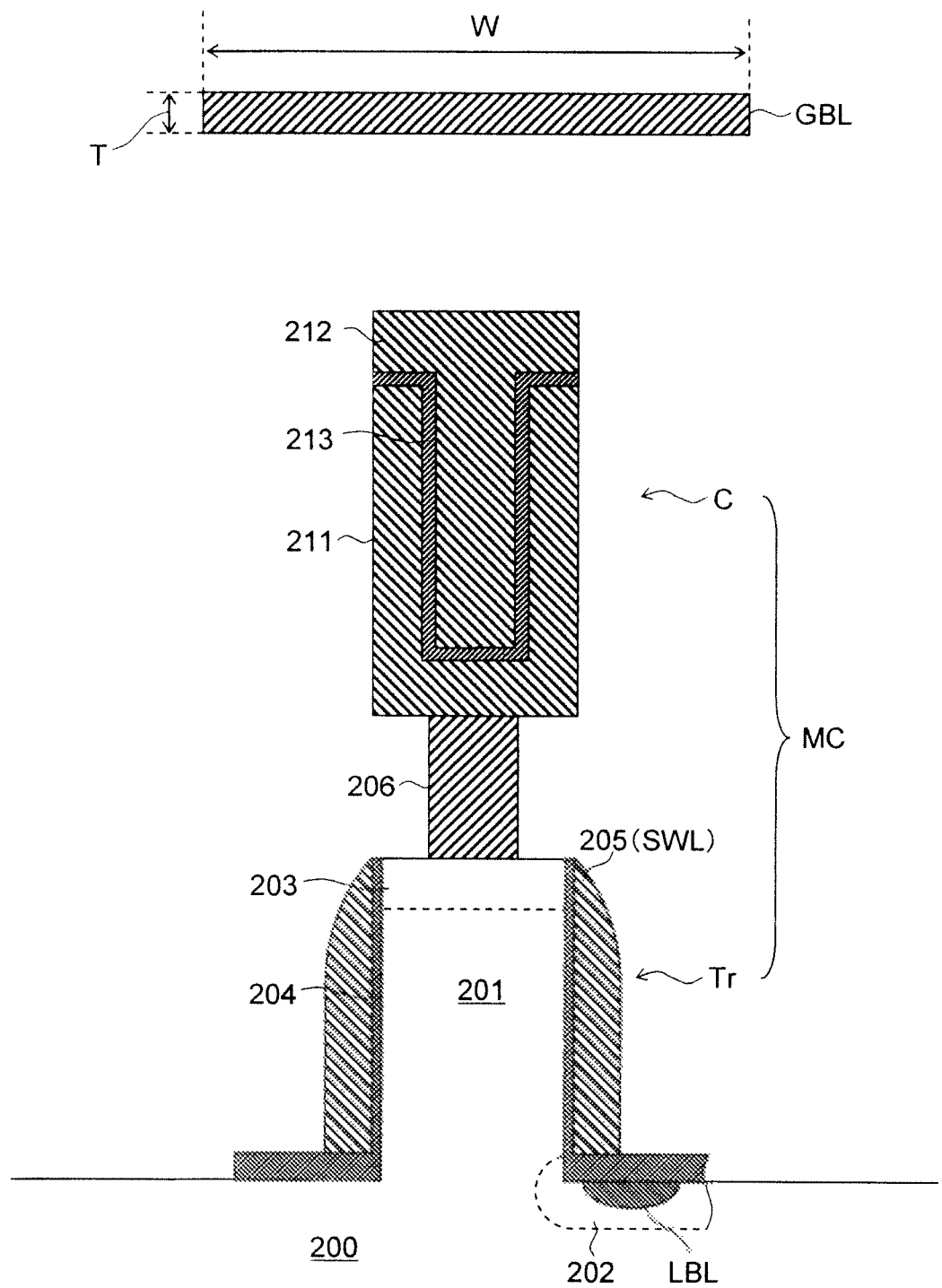
FIG. 5 is a cross section showing a physical structure of the memory cell.

FIG. 5 is a cross section showing a physical structure of the memory cell MC.

As shown in FIG. 5, in the present embodiment, the memory cell MC is composed of a series circuit of one cell transistor Tr (an access transistor) and one cell capacitor C (a memory element) as an example. The cell transistor Tr is a pillar MOS transistor (a vertical transistor) having a pillar-shaped channel 201 that is perpendicular to a main plane of a semiconductor substrate 200. On the bottom and the top of the pillar-shaped channel 201, diffusion layers 202 (the local bit line LBL) and 203 (storage contact side of the memory cell MC) are provided, respectively, and a lateral side of the pillar-shaped channel 201 is surrounded by a gate electrode 205 via a gate insulating layer 204. With this configuration, when a predetermined voltage is applied to the gate electrode 205, the upper and the lower diffusion layers 202 and 203 are electrically connected to each other. The gate electrode 205 functions as the sub-word line SWL. With this structure, it is possible to form one memory cell MC in an area of $4F^2$ (where F is the minimum feature size). A $4F^2$ memory cell MC is a 1-intersection 1-cell type in which a memory cell is arranged at every intersections of the sub-word line SWL with the local bit line LBL. An arrangement pitch of the local bit line LBL of the $4F^2$ memory cell MC may be smaller than an arrangement pitch of the local bit line of the memory cell MC of a $6F^2$ type or higher. In this case, it is also desirable to configure the hierarchy switch that is constituted by a transistor attached to the local bit line LBL with the same vertical transistor as the access transistor of the memory cell MC. Therefore, the ON resistance of the vertical transistor (hierarchy switch) in the ON state increases higher than the ON resistance of the hierarchy switch attached to the local bit line LBL of the memory cell MC of the $6F^2$ type or higher having a large arrangement pitch. Because a large number of access transistors are connected to the local bit line, the load (distributed constant) of the hierarchy switch and the local bit line viewed from the global bit line (or viewed from the sense amplifier) is considerably heavier than the load of the global bit line in a total. Because all the sub-word lines can be used as effective sub-word lines in the $4F^2$ memory cell MC, for example, it is not necessary to set word lines arranged in every two lines as the dummy word lines.

The lower diffusion layer 202 is connected to the local bit line LBL that is embedded in the semiconductor substrate 200. In this manner, in the present embodiment, because the local bit line LBL is embedded in the semiconductor substrate 200, a cross coupling of the local bit line LBL and the sub-word line SWL is remarkably small compared to a case of using a normal planar transistor. Therefore, in the present embodiment, it is less necessary to deliver the word line noise to the local bit line LBL of the reference side by using the dummy word line. This is why the dummy word line is not employed in the present embodiment. The diffusion layer 202 (the local bit line LBL) can be made of an arsenic (As) doped polycrystalline silicon, tungsten, or other metal materials.

The upper diffusion layer 203 (a storage contact side of the memory cell MC) is connected to a lower electrode 211 of the cell capacitor C via a contact plug 206. The cell capacitor C includes the lower electrode 211, an upper electrode 212, and a capacitor insulating layer 213 formed between the lower electrode 211 and the upper electrode 212. The upper electrode 212 is connected to a predetermined fixed potential. The global bit line GBL is formed above the cell capacitor C. The global bit line GBL is formed using an upper layer line, and a line pitch of the global bit line GBL can be equal to or two times a line pitch of the local bit line LBL. Therefore, it is possible to set a line width W of the global bit line GBL sufficiently thick. In addition, because the upper layer line is used for the global bit line GBL, a thickness T of the line also increases. Furthermore, it is possible to use copper (Cu) having a low electrical resistance as the material for the global bit line GBL. As a result, it is possible to set a line resistance (specific resistance per unit length) of the global bit line GBL sufficiently lower than that of the local bit line LBL.

The configuration of the semiconductor device according to the present embodiment is as explained above. An operation of the semiconductor device according to the present embodiment is explained next.

Figure 6:
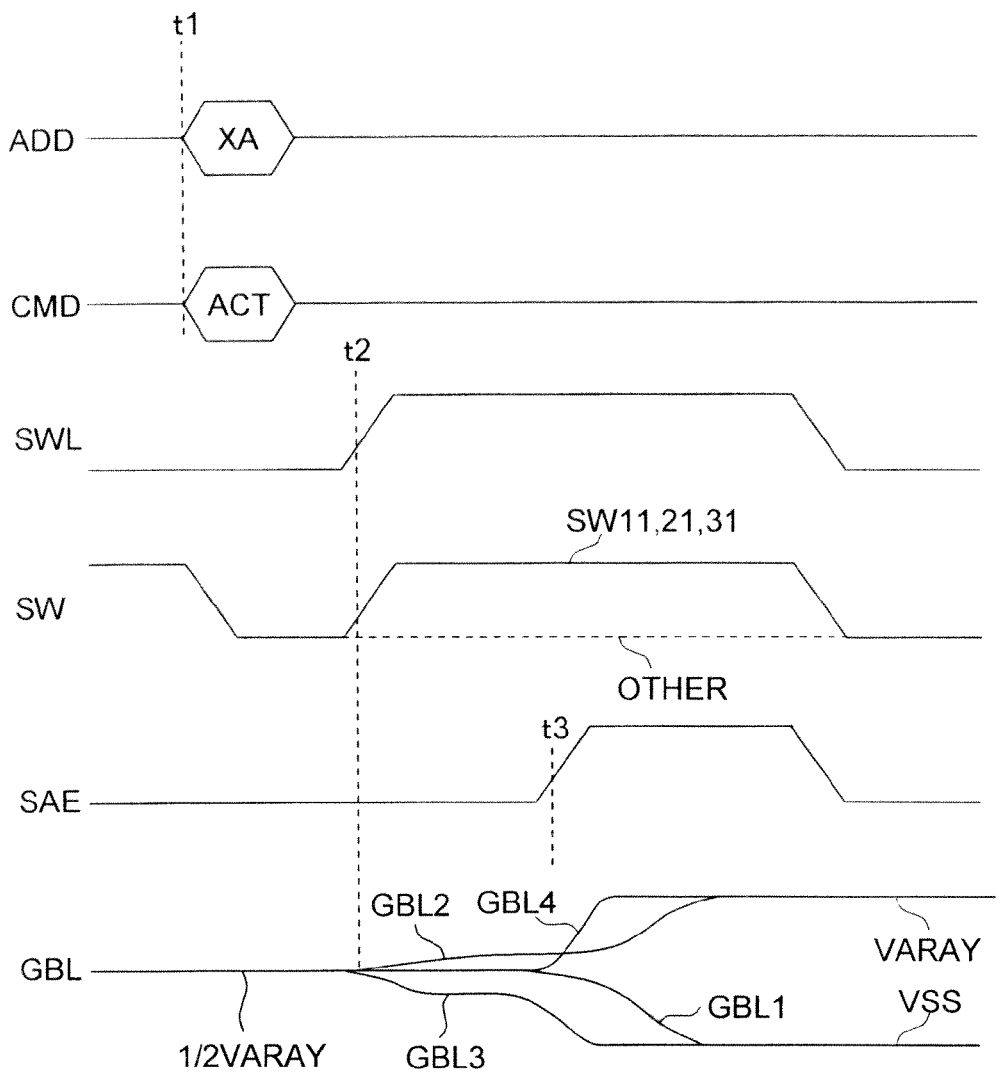
FIG. 6 is an example of a timing chart for explaining an operation of the semiconductor device according to the present embodiment.

FIG. 6 is an example of a timing chart for explaining an operation of the semiconductor device according to the present embodiment.

First, in a state before a row address XA is input, all the global bit lines GBL and the local bit lines LBL are pre-charged to a predetermined potential (for example, VARAY/2, where VARAY is a voltage of a high voltage side of the sense amplifier, for example, 1.2 V (volts)) for a predetermined time by a bit line pre-charge circuit (not shown). It is preferable to pre-charge from the global bit line GBL side in a state in which all the hierarchy switches SW are switched on. It is because a low resistance in the ON state can be realized with a transistor having the same structure as the transistor structure constituting the sense amplifier of which the ON resistance in the ON state is low. The global bit line GBL represents a potential at the sense amplifier SA.

As shown in FIG. 6, if an active command ACT and a row address XA are input at a time t1, a corresponding sub-word line SWL is activated at a time t2. In the present example the activated sub-word line SWL belongs to, as shown in FIG. 3, the memory block MB21 included in the memory mat MAT2. That is, the memory block MB21 is the access side block.

At the time t2, hierarchy switches SW is activated based on the row address X7 to X10 (or more). One of the hierarchy switches activated is a hierarchy switch SW21 corresponding to the memory block MB21 that is the access side block, and the others are hierarchy switches SW11 and SW31 corresponding to the memory blocks MB11 and MB31 that are the reference side blocks, respectively. With this operation, each of the global bit lines GBL2 and GBL3 shown in FIG. 2 is connected to the memory cell MC via its corresponding local bit line LBL. On the other hand, each of the global bit lines GBL1 and GBL4 is connected to its corresponding local bit line LBL, but is not connected to a memory cell or a dummy cell.

When the hierarchy switches SW are activated, each of potentials of the global bit lines GBL2 and GBL3 on the access side is changed based on information stored in the memory cell MC. Specifically, if the cell capacitor C is charged to a low level, the potential of the global bit line GBL is slightly decreased, and if the cell capacitor C is charged to a high level, the potential of the global bit line GBL is slightly increased. In the example shown in FIG. 6, the potential of the global bit line GBL2 is increased, and the potential of the global bit line GBL3 is decreased.

At this time, timings and waveforms of potential changes of the global bit lines GBL2 and GBL3 viewed from the sense amplifier SA depend on a distance from the activated hierarchy switch SW to the sense amplifier SA. Specifically, the farther the activated hierarchy switch SW is from the sense amplifier SA, the later the timing of the potential change appears in the sense amplifier SA. On the contrary, the closer the activated hierarchy switch SW is from the sense amplifier SA, the earlier the timing of the potential change appears in the sense amplifier SA. The waveforms of the potential changes also slightly differ according to the distance. In the example shown in FIG. 6, the memory block MB21 that is the access side block is relatively far from the sense amplifier SA1 and relatively close to the sense amplifier SA2. Therefore, the potential change of the global bit line GBL2 at an input terminal in the sense amplifier SA1 appears relatively late, and the potential change of the global bit line GBL3 at an input terminal in the sense amplifier SA2 appears relatively early.

After a sufficient potential difference appears on each of the global bit lines GBL, a sense amplifier activation signal SAE is activated at a time t3, by which the sense amplifier SA begins a sensing operation. With this operation, the potential of the global bit line GBL2 of the access side is increased to VARAY, and the potential of the global bit line GBL1 of the reference side, which forms a pair with the global bit line GBL2, is decreased to VSS. Similarly, the potential of the global bit line GBL3 of the access side is decreased to VSS, and the potential of the global bit line GBL4 of the reference side, which forms a pair with the global bit line GBL3, is increased to VARAY.

The most important time here is a time of sensing a slight potential difference at the time t3 (an initial period after starting the sensing: initial sensing stage). From the sense amplifier (based on the sense amplifier), load models (parasitic CR models) of both a reference local bit line to be added to the reference side global bit line and an access side local bit line to be added to the access side global bit line are completely consistent with each other. It is because positions of the hierarchy switches of both sides, which are switched on, are the same as positions on the global bit lines of both sides from the sense amplifier. Therefore, at the initial sensing stage, the sense amplifiers can operate with the same load model.

The load model of the sense amplifier SA1 is different from the load model of the sense amplifier SA2. However, what is important is that the load models of the access side and the reference side of an individual sense amplifier are the same at the initial sensing stage. For example, it is important that balances of four vectors are consistent with each other, including a first vector with which the sense amplifier that is composed of a CMOS tries to charge the global bit line of the access side to a high level, a second vector with which the sense amplifier tries to charge the global bit line of the access side to a low level, a third vector with which the sense amplifier tries to charge the global bit line of the reference side to a high level, and a fourth vector with which the sense amplifier tries to charge the global bit line of the reference side to a low level. Each of the four vectors is greatly influenced by its corresponding load model. This is a very important technical concept for sensing a voltage difference equal to or smaller than 0.1 V. In the present embodiment, it can be expressed that the load model of a hierarchy switch to be switched on viewed from the farthest sense amplifier SA1 is heavier than the load model viewed from the sense amplifier SA2. For example, assume that a differential potential in the sense amplifier SA1 at the time of starting a sensing (an initial time after starting a sensing) is 50 mV (millivolts) and a differential potential in the sense amplifier SA2 is 60 mV (it is assumed that both the sense amplifiers SA1 and SA2 can sense up to a differential potential of 30 mV without introducing errors). However, if the above four vectors of the sense amplifier SA1 are consistent with each other, the sense amplifier SA1 can perform the sensing of 50 mV at a first speed without introducing errors. If the above four vectors of the sense amplifier SA2 are consistent with each other, the sense amplifier SA2 can perform the sensing of 60 mV at a second speed without introducing errors. The first speed is slightly slower than the second speed. However, what the present invention puts a focus on is the sensitivity (balance) at the initial sensing stage.

A system to which the present invention is applied is explained next.

Figure 7:
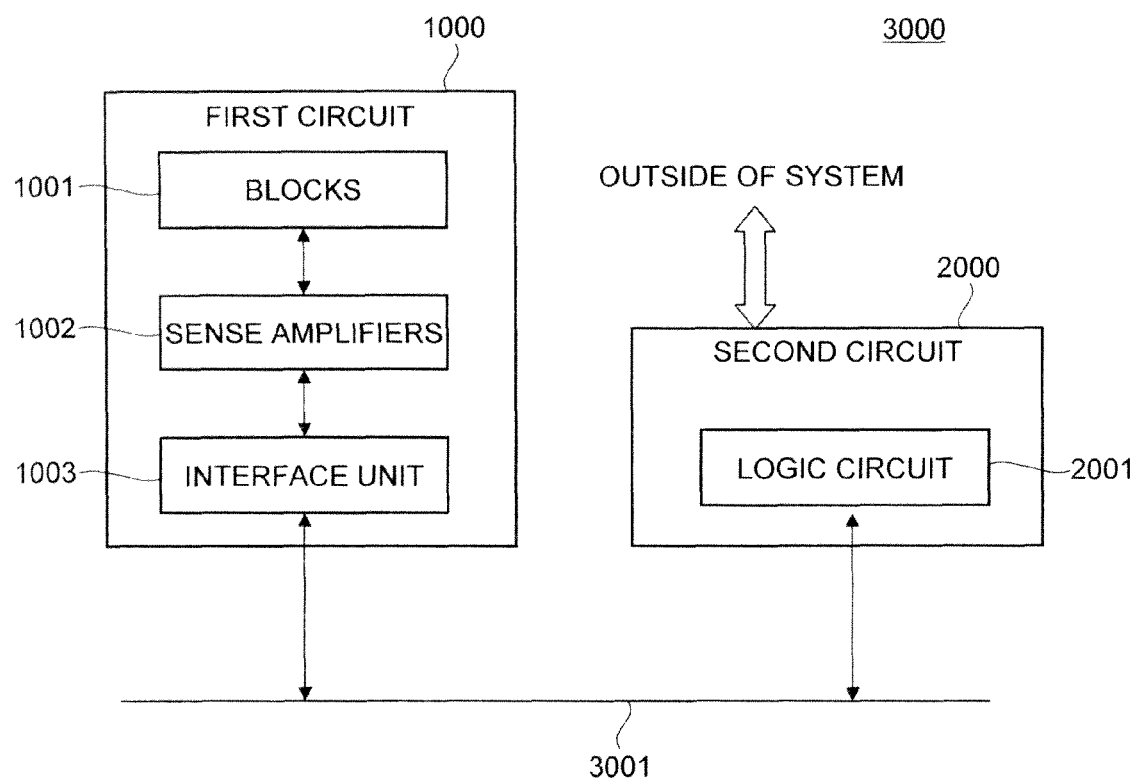
FIG. 7 is block diagram of system employing the semiconductor device according to the present embodiment.

FIG. 7 is block diagram of system employing the semiconductor device according to the present embodiment. The present invention constitutes a system 3000. The system 3000 includes a first circuit 1000 corresponding to the circuit shown in FIG. 1 and a second circuit 2000 that controls the first circuit. The second circuit has a function of communicating with the outside of the system and a function of communicating with other circuits (not shown) in the system. The second circuit 2000 includes a logic circuit 2001 for controlling the first circuit. The first circuit 1000 includes an interface unit 1003 for communicating with the second circuit, a plurality of blocks 1001 having a plurality of pieces of information, a plurality of sense amplifiers 1002 each sensing each of the pieces of information, a plurality of decoders (not shown) corresponding to the circuits shown in FIG. 4, and other control circuits required for an access. A bus 3001 in the system is a signal line for transferring the pieces of information, including a plurality of control signals required for the first circuit and the second circuit to communicate the information. The second circuit has a function of accessing the pieces of information of the first circuit. This system 3000 has a performance of processing the information with a high sensing sensitivity as described above.

The first circuit and the second circuit are formed on the same semiconductor substrate or on different semiconductor substrates from each other. The first circuit and the second circuit can be sealed with the same packaging material or different packaging materials from each other. The first circuit and the second circuit can be mounted in a layered structure or can be planar mounted. This system 3000 can include a circuit having the other function (a third circuit).

As described above, according to the present embodiment, because the access side memory block and the reference side memory block are allocated symmetrically with respect to the sense amplifier array SAA, even when the length of the global bit line is long, it is possible to perform a highly sensitive sensing operation regardless of an access position. As a result, it is possible to increase the number of memory cells per one sense amplifier SA, contributing to a reduction of the chip dimension.

It is apparent that the present invention is not limited to the above embodiments, but may be modified and changed without departing from the scope and spirit of the invention.

For example, in the above embodiment, although the access side memory block and the reference side memory block are allocated symmetrically with respect to the sense amplifier array SAA, it is not essential to allocate symmetrically as long as a distance from a sense amplifier SA to a hierarchy switch SW to be activated along the global bit line GBL is substantially consistent.

Furthermore, in the above embodiment, although the addresses of the memory mat MAT and the memory block MB are allocated symmetrically with respect to the sense amplifier array SAA, this is not essential in the present invention. However, in a case where the addresses are not allocated symmetrically, it is necessary to perform an address conversion to select a hierarchy switch SW of the reference side in such a manner that the distance from the sense amplifier SA to the hierarchy switch SW to be activated along the global bit line GBL is substantially equal in the access side and the reference side.

Moreover, in the above embodiment, although a case where the present invention is applied to a DRAM is explained as an example, the target of the present invention is not limited to DRAMs, and the present invention can be widely applied to other types of semiconductor devices. For example, a nonvolatile element (such as a PRAM employing a phase change memory element) can be used instead of the cell capacitor C.

The basic technical concept present is not limited to the above method, and the forma each of the circuits is not limited to the circuit format described in the above embodiment. The circuit configuration of the sense amplifier is no object as far as it is a differential type. A differential sense amplifier in which the global bit line of the access side and the global bit line of the reference side are input to single end type gates, respectively, can be also applied. Furthermore, the equalize voltage of the bit line is not limited to VARAY/2, but can be a low voltage at the VSS side or a high voltage at the VARAY side. Moreover, if the transistor is an FET (Field Effect Transistor), it is possible to use various FETs, such as an MIS (Metal-Insulator Semiconductor) and a TFT (Thin Film Transistor) as well as an MOS (Metal Oxide Semiconductor) transistor. In addition, a bipolar transistor can be also used.

The present invention can be applied to semiconductor devices such as a memory, a CPU (Central Processing Unit), an MCU (Micro Controller Unit), or a DSP (Digital Signal Processor). In addition, an NMOS transistor (N-channel MOS transistor) is a representative example of a first conductive transistor, and a PMOS transistor (P-channel MOS transistor) is a representative example of a second conductive transistor.

Further, many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A device comprising:
   a first sense amplifier array including a plurality of first sense amplifiers that are arranged in a first direction, each of the first sense amplifiers including first and second nodes;
   a plurality of first global bit lines each extending in a second direction crossing the first direction, the first global bit lines being arranged in the first direction on a left side of the first sense amplifier array so that each of the first global bit lines being operatively connected to the first node of an associated one of the first sense amplifiers;
   a plurality of second global bit lines each extending in the second direction, the second global bit lines being arranged in the first direction on a right side of the first sense amplifier array so that each of the second global bit lines being operatively connected to the second node of the associated one of the first sense amplifiers;
   a first memory block including a plurality of first local bit lines that are arranged in the first direction and a plurality of first hierarchy switches each coupled between an associated one of the first global bit lines and an associated one of the first local bit lines, the first memory block being disposed on the left side of the first sense amplifier array;

a second memory block including a plurality of second local bit lines that are arranged in the first direction and a plurality of second hierarchy switches each coupled between an associated one of the first global bit lines and an associated one of the second local bit lines, the second memory block being disposed on the left side of the first sense amplifier array and sandwiched between the first sense amplifier array and the first memory block;

a third memory block including a plurality of third local bit lines that are arranged in the first direction and a plurality of third hierarchy switches each coupled between an associated one of the second global bit lines and an associated one of the third local bit lines, the third memory block being disposed on the right side of the first sense amplifier array; and a fourth memory block including a plurality of fourth local bit lines that are arranged in the first direction and a plurality of fourth hierarchy switches each coupled between an associated one of the second global bit lines and an associated one of the fourth local bit lines, the fourth memory block being disposed on the right side of the first sense amplifier array and sandwiched between the first sense amplifier array and the third memory block;

the first, second, third and fourth memory blocks being address-mapped such that the first and third hierarchy switches are rendered conductive while keeping the second and fourth hierarchy switches non-conductive and the second and fourth hierarchy switches are rendered conductive while keeping the first and third hierarchy switches non-conductive.

2. The device as claimed in claim 1,
wherein the first memory block includes a plurality of first word lines each crossing the first local bit lines and a plurality of first memory cells each disposed at a corresponding one of intersections of the first word lines and the first local bit lines;
wherein the second memory block includes a plurality of second word lines each crossing the second local bit lines and a plurality of second memory cells each disposed at a corresponding one of intersections of the second word lines and the second local bit lines;
wherein the third memory block includes a plurality of third word lines each crossing the third local bit lines and a plurality of third memory cells each disposed at a corresponding one of intersections of the third word lines and the third local bit lines; and
wherein the fourth memory block includes a plurality of fourth word lines each crossing the fourth local bit lines and a plurality of fourth memory cells each disposed at a corresponding one of intersections of the fourth word lines and the fourth local bit lines.

3. The device as claimed in claim 2, wherein each of the first, second, third and fourth memory cells includes a cell transistor and a cell capacitor connected in series.

4. The device as claimed in claim 1,
wherein the device further comprises:
a second sense amplifier array including a plurality of second sense amplifiers that are arranged in the first direction, each of the second sense amplifiers including third and fourth nodes;

a plurality of third global bit lines each extending in the second direction, the third global bit lines being arranged in the first direction on a left side of the second sense amplifier array so that each of the third global bit lines being operatively connected to the third node of an associated one of the second sense amplifiers;

a plurality of fourth global bit lines each extending in the second direction, the fourth global bit lines being arranged in the first direction on a right side of the second sense amplifier array so that each of the fourth global bit lines being operatively connected to the fourth node of the associated one of the second sense amplifiers;

a fifth memory block including a plurality of fifth local bit lines that are arranged in first direction and a plurality of fifth hierarchy switches each coupled between an associated one of the fourth global bit lines and an associated one of the fifth local bit lines, the fifth memory block being disposed on the right side of the second sense amplifier array; and a sixth memory block including a plurality of sixth local bit lines that are arranged in first direction and a plurality of sixth hierarchy switches each coupled between an associated one of the fourth global bit lines and an associated one of the sixth local bit lines, the sixth memory block being disposed on the right side of the second sense amplifier array and sandwiched between the second sense amplifier array and the fifth memory block;

wherein the third memory block further includes a plurality of seventh local bit lines that are arranged in the first direction and a plurality of seventh hierarchy switches each coupled between an associated one of the third global bit lines and an associated one of the seventh local bit lines;

wherein the fourth memory block further includes a plurality of eighth local bit lines that are arranged in the first direction and a plurality of eighth hierarchy switches each coupled between an associated one of the third global bit lines and an associated one of the eighth local bit lines; and wherein the fifth and sixth memory blocks are address-mapped such that the sixth and seventh hierarchy switches are rendered conductive while keeping the fifth and eighth hierarchy switches non-conductive and the fifth and eighth hierarchy switches are rendered conductive while keeping the sixth and seventh hierarchy switches non-conductive.

5. The device as claimed in claim 4, wherein the first, second, third, fourth, fifth and sixth memory blocks are address-mapped such that first, third, sixth and seventh hierarchy switches are rendered conductive while keeping the second, fourth, fifth and eighth hierarchy switches non-conductive and the second, fourth, fifth and eighth hierarchy switches are rendered conductive while keeping the first, third, sixth and seventh hierarchy switches non-conductive.

6. The device as claimed in claim 5, wherein the second and third global bit lines are mixed with each other in the third and fourth memory blocks.

7. The device as claimed in claim 5, wherein the second and third global bit lines are arranged alternately with each other in the third and fourth memory blocks.

8. A device comprising:
a first sense amplifier array including a plurality of first sense amplifiers arranged in a first direction, each of the first sense amplifiers including first and second nodes;

a second sense amplifier array including a plurality of second sense amplifiers arranged in the first direction, each of the second sense amplifiers including third and fourth nodes;

a first memory mat disposed between the first and second sense amplifier arrays, the first memory mat including a plurality of first memory blocks arranged in a second direction that is substantially perpendicular to the first direction;

a second memory mat disposed on an opposite side to the first memory mat with respect to the first sense amplifier array, the second memory mat including a plurality of second memory blocks arranged in the second direction;

a third memory mat disposed on an opposite side to the first memory mat with respect to the second sense amplifier array, the third memory mat including a plurality of third memory blocks arranged in the second direction;

a plurality of first global bit lines each elongated from the first node of an associated one of the first sense amplifiers in the second direction to cross over each of the first memory blocks;

a plurality of second global bit lines each elongated from the second node of the associated one of the first sense amplifiers in the second direction to cross over each of the second memory blocks;

a plurality of third global bit lines each elongated from the third node of the associated one of the second sense amplifiers in the second direction to cross over each of the first memory blocks; and a plurality of fourth global bit lines each elongated from the fourth node of the associated one of the second sense amplifiers in the second direction to cross over each of the third memory blocks;

each of the first, second and third memory blocks including a plurality of local bit lines arranged in the first direction and a plurality of hierarchy switches each coupled between an associated one of corresponding ones of the first, second, third and fourth global bit lines and an associated one of the local bit lines;

the first, second and third memory blocks being address-mapped such that the hierarchy switches belonging to one of the second memory blocks, the hierarchy switches belonging to one of the first memory blocks and the hierarchy switches belonging to one of the third memory blocks are rendered conductive while keeping the hierarchy switches belonging to each of remaining ones of the first, second and third memory blocks non-conductive, the one of the second memory blocks and the one of the first memory blocks being symmetrical in position with respect to the first sense amplifier array, and the one of the first memory blocks and the one of the third memory blocks being symmetrical in position with respect to the second sense amplifier array.

9. The device as claimed in claim 8, wherein each of the first, second and third memory mats includes at least four memory blocks.

10. The device as claimed in claim 8, wherein each of the first, second and third memory blocks further includes a plurality of word lines each intersecting each of the local bit lines and a plurality of memory cells each disposed at a corresponding one of intersections of the word lines and the local bit lines.

11. A device comprising:

a first sense amplifier array including a plurality of first sense amplifiers that are arranged in a first direction, each of the first sense amplifiers including first and second nodes;

a plurality of first bal bit lines each extending in a second direction crossing the first direction, the first global bit lines being arranged in the first direction on a left side of the first sense amplifier array so that each of the first global bit lines being operatively connected to the first node of an associated one of the first sense amplifiers;

a plurality of second global bit lines each extending in the second direction, the second global bit lines being arranged in the first direction on a right side of the first sense amplifier array so that each of the second global bit lines being operatively connected to the second node of the associated one of the first sense amplifiers;

a first memory block including a plurality of first local bit lines that are arranged in the first direction and a plurality of first hierarchy switches each coupled between an associated one of the first global bit lines and an associated one of the first local bit lines, the first memory block being disposed on the left side of the first sense amplifier array;

a second memory block including a plurality of second local bit lines that are arranged in the first direction and a plurality of second hierarchy switches each coupled between an associated one of the first global bit lines and an associated one of the second local bit lines, the second memory block being disposed on the left side of the first sense amplifier array and sandwiched between the first sense amplifier array and the first memory block;

a third memory block including a plurality of third local bit lines that are arranged in the first direction and a plurality of third hierarchy switches each coupled between an associated one of the second global bit lines and an associated one of the third local bit lines, the third memory block being disposed on the right side of the first sense amplifier array; and a fourth memory block including a plurality of fourth local bit lines that are arranged in the first direction and a plurality of fourth hierarchy switches each coupled between an associated one of the second global bit lines and an associated one of the fourth local bit lines, the fourth memory block being disposed on the right side of the first sense amplifier array and sandwiched between the first sense amplifier array and the third memory block;

the first, second, third and fourth memory blocks being address-mapped such that the first and third hierarchy switches are exclusively accessed as pair and the second and fourth hierarchy switches are exclusively accessed as pair, respectively.

12. The device as claimed in claim 11, wherein the first and third hierarchy switches are rendered conductive while keeping the second and fourth hierarchy switches non-conductive and the second and fourth hierarchy switches are rendered conductive while keeping the first and third hierarchy switches non-conductive.

13. The device as claimed in claim 11, further comprising a plurality of first memory cells comprised in each of the first to fourth memory blocks and coupled an associated one of the first to fourth local bit lines, respectively, and each of the first memory cells includes a series circuit of a first cell transistor and a first memory element, and the first cell transistor is constituted by a first pillar transistor having a pillar-shaped channel that is perpendicular to a main surface of a semiconductor substrate.

14. The device as claimed in claim 13, wherein each of the first to fourth hierarchy switches is constituted by the first pillar transistor.

15. The device as claimed in claim 14, wherein the first to fourth local bit lines are embedded in the semiconductor substrate, and the first and second global bit lines are formed over the semiconductor substrate.

16. The device as claimed in claim 13, wherein the first memory element includes first and second electrodes, the first electrode coupled a one of source/drain nodes of the first pillar transistor via a contact plug.

17. The device as claimed in claim 11, wherein the first to fourth local bit lines are embedded in a semiconductor substrate as a diffusion layer, and the first and second global bit lines are formed over the semiconductor substrate.

18. The device as claimed in claim 17, wherein the diffusion layer comprises tungsten or other metal materials.

19. The device as claimed in claim 11, further comprising:
a second sense amplifier array including a plurality of second sense amplifiers that are arranged in the first direction, each of the second sense amplifiers including third and fourth nodes;
a plurality of third global bit lines each extending in the second direction, the third global bit lines being arranged in the first direction on the right side of the first sense amplifier array and a left side of the second sense amplifier array so that each of the third global bit lines being operatively connected to the third node of an associated one of the second sense amplifiers;
a plurality of fourth global bit lines each extending in the second direction, the fourth global bit lines being arranged in the first direction on a right side of the second sense amplifier array so that each of the fourth global bit lines being operatively connected to the fourth node of the associated one of the second sense amplifiers;
a fifth memory block including a plurality of fifth local bit lines that are arranged in the first direction and a plurality of fifth hierarchy switches each coupled between an associated one of the fourth global bit lines and an associated one of the fifth local bit lines, the fifth memory block being disposed on the right side of the second sense amplifier array; and
a sixth memory block including a plurality of sixth local bit lines that are arranged in the first direction and a plurality of sixth hierarchy switches each coupled between an associated one of the fourth global bit lines and an associated one of the sixth local bit lines, the sixth memory block being disposed on the right side of the second sense amplifier array and sandwiched between the second sense amplifier array and the fifth memory block;
the third memory block further including a plurality of seventh local bit lines that are arranged in the first direction and a plurality of seventh hierarchy switches each coupled between an associated one of the third global bit lines and an associated one of the seventh local bit lines;
the fourth memory block further including a plurality of eighth local bit lines that are arranged in the first direction and a plurality of eighth hierarchy switches each coupled between an associated one of the third global bit lines and an associated one of the eighth local bit lines;
the third, fourth, fifth and sixth memory blocks being address-mapped such that the fifth and eighth hierarchy switches are exclusively accessed as pair and the sixth and seventh hierarchy switches are exclusively accessed as pair, respectively.

20. The device as claimed in claim 19, wherein the fifth and eighth hierarchy switches are rendered conductive while keeping the sixth and seventh hierarchy switches non-conductive and the sixth and seventh hierarchy switches are rendered conductive while keeping the fifth and eighth hierarchy switches non-conductive.

21. The device as claimed in claim 19, further comprising a plurality of second memory cells comprised the third to sixth memory blocks and coupled an associated one of the fifth to eighth local bit lines, respectively, and each of the second memory cells includes a series circuit of a second cell transistor and a second memory element, and the second cell transistor is constituted by a second pillar transistor having a pillar-shaped channel that is perpendicular to a main surface of a semiconductor substrate.

22. The device as claimed in claim 21, wherein each of the fifth to eighth hierarchy switches is constituted by the second pillar transistor.

23. The device as claimed in claim 22, wherein the fifth to eighth local bit lines are embedded in the semiconductor substrate, and the third and fourth global bit lines are formed over the semiconductor substrate.

24. The device as claimed in claim 21, wherein the second memory element includes a third and fourth electrodes, the third electrode coupled a one of source/drain nodes of the second pillar transistor via a contact plug.

25. The device as claimed in claim 19, wherein the fifth to eighth local bit lines are embedded in a semiconductor substrate as a diffusion layer, and the third and fourth global bit lines are formed over the semiconductor substrate.

26. The device as claimed in claim 25, wherein the diffusion layer comprises tungsten or other metal materials.

* * * * *